United States Patent
Czornomaz et al.

(10) Patent No.: US 10,840,264 B2
(45) Date of Patent: Nov. 17, 2020

(54) ULTRA-THIN-BODY GAN ON INSULATOR DEVICE

(71) Applicant: INTERNATIONAL BUSINESS MACHINES CORPORATION, Armonk, NY (US)

(72) Inventors: Lukas Czornomaz, Zurich (CH); Herwig Hahn, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/718,215

(22) Filed: Sep. 28, 2017

(65) Prior Publication Data

US 2019/0096916 A1    Mar. 28, 2019

(51) Int. Cl.
*H01L 27/12* (2006.01)
*H01L 29/06* (2006.01)
(Continued)

(52) U.S. Cl.
CPC ...... *H01L 27/1207* (2013.01); *H01L 21/0254* (2013.01); *H01L 21/02458* (2013.01);
(Continued)

(58) Field of Classification Search
CPC ............ H01L 21/2007; H01L 21/8258; H01L 27/0605; H01L 29/2003; H01L 29/7781; H01L 29/7787; H01L 27/0688; H01L 27/15; H01L 31/02327; H01L 31/03044; H01L 31/03048; H01L 31/035236; H01L 31/035281; H01L 31/0392; H01L 31/105; H01L 31/12; H01L 31/125; H01L 31/153; H01L 33/0079; H01L 33/06; H01L 33/12;
(Continued)

(56) References Cited

U.S. PATENT DOCUMENTS

| 6,455,398 B1 * | 9/2002 | Fonstad, Jr. ......... G02B 6/1245 257/E21.088 |
| 7,732,301 B1 | 6/2010 | Pinnington et al. |

(Continued)

FOREIGN PATENT DOCUMENTS

WO    2016209282 A1    12/2016

OTHER PUBLICATIONS

Chung et al., "GaN-on-Si Technology, A New Approach for Advanced Devices in Energy and Communications," Proceedings of the European Solid-State Device Research Conference 2010, Institute of Electrical and Electronics Engineering (IEEE), Final published version: Mar. 2, 2017, Copyright IEEE 2010, pp. 52-56.

(Continued)

*Primary Examiner* — Mark W Tornow
*Assistant Examiner* — Priya M Rampersaud
(74) *Attorney, Agent, or Firm* — Jordan T. Schiller

(57) ABSTRACT

An ultra-thin-body GaN-on-Insulator device and a method of manufacturing may be provided. The device comprises a front-end-of-line processed CMOS platform terminated with an interlayer dielectric material, a first bonding layer atop the interlayer dielectric material and an ultra-thin-body GaN-based hetero-structure terminated with a second bonding layer. The GaN-based hetero-structure is bonded with the second bonding layer to the first bonding layer of the CMOS platform building the ultra-thin-body GaN-on-Insulator device.

9 Claims, 8 Drawing Sheets

(51) Int. Cl.
*H01L 29/205* (2006.01)
*H01L 23/31* (2006.01)
*H01L 21/762* (2006.01)
*H01L 21/02* (2006.01)
*H01L 29/778* (2006.01)
*H01L 29/66* (2006.01)
*H01L 21/8258* (2006.01)
*H01L 29/08* (2006.01)
*H01L 27/085* (2006.01)
*H01L 29/20* (2006.01)
*H01L 27/092* (2006.01)
*H01L 29/417* (2006.01)

(52) U.S. Cl.
CPC .... *H01L 21/76251* (2013.01); *H01L 21/8258* (2013.01); *H01L 23/3171* (2013.01); *H01L 27/085* (2013.01); *H01L 29/0649* (2013.01); *H01L 29/0657* (2013.01); *H01L 29/0843* (2013.01); *H01L 29/205* (2013.01); *H01L 29/66462* (2013.01); *H01L 29/7781* (2013.01); *H01L 29/7787* (2013.01); *H01L 27/092* (2013.01); *H01L 29/2003* (2013.01); *H01L 29/41766* (2013.01)

(58) Field of Classification Search
CPC ............ H01L 33/32; H01L 2933/0066; H01L 33/007; H01L 33/0075; H01L 33/62; H01L 21/02458; H01L 21/0254; H01L 21/76251; H01L 23/3171; H01L 27/085; H01L 27/092; H01L 27/1207; H01L 29/0649; H01L 29/0657; H01L 29/0843; H01L 29/205; H01L 29/41766; H01L 29/66462; H01L 21/187; H01L 21/762; H01L 21/76224; H01L 21/823871
See application file for complete search history.

(56) References Cited

U.S. PATENT DOCUMENTS

| | | | |
|---|---|---|---|
| 8,058,137 B1 | 11/2011 | Or-Bach et al. | |
| 8,163,581 B1 | 4/2012 | Or-Bach et al. | |
| 8,710,511 B2 | 4/2014 | Gambin et al. | |
| 8,895,421 B2 | 11/2014 | Parikh et al. | |
| 9,490,324 B2 | 11/2016 | Mishra et al. | |
| 9,496,137 B2 | 11/2016 | Chu et al. | |
| 9,502,421 B2 | 11/2016 | Hirler et al. | |
| 2007/0022940 A1 | 2/2007 | Boussagol et al. | |
| 2008/0070355 A1* | 3/2008 | Lochtefeld | H01L 27/0605 438/172 |
| 2009/0075455 A1 | 3/2009 | Mishra | |
| 2009/0085065 A1* | 4/2009 | Mishra | H01L 21/187 257/194 |
| 2009/0278233 A1 | 11/2009 | Pinnington et al. | |
| 2010/0084688 A1* | 4/2010 | Lu | H01L 29/7787 257/194 |
| 2010/0127353 A1 | 5/2010 | Letertre et al. | |
| 2012/0193638 A1 | 8/2012 | Keller et al. | |
| 2012/0193677 A1* | 8/2012 | Parikh | H01L 29/1075 257/190 |
| 2012/0229176 A1* | 9/2012 | Briere | H01L 27/0617 327/109 |
| 2012/0288995 A1 | 11/2012 | El-Ghoroury et al. | |
| 2012/0305992 A1 | 12/2012 | Marino et al. | |
| 2013/0214284 A1 | 8/2013 | Holder et al. | |
| 2013/0234145 A1* | 9/2013 | Hirler | H01L 27/092 257/76 |
| 2015/0318276 A1* | 11/2015 | Bayram | H01L 27/1207 257/195 |
| 2016/0327737 A1* | 11/2016 | Zhang | H01L 21/8258 |
| 2019/0006171 A1* | 1/2019 | Dasgupta | H01L 21/02532 |

OTHER PUBLICATIONS

Li et al., "Ultrathin Body GaN-on-Insulator Quantum Well FETs With Regrown Ohmic Contacts," IEEE Electron Device Letters, vol. 33, No. 5, May 2012, Copyright 2012 IEEE, pp. 661-663.

Herfurth et al., "Ultrathin Body InAlN/GaN HEMTs for High-Temperature (600° C.) Electronics," IEEE Electron Device Letters, vol. 34, No. 4, Apr. 2013, Copyright 2013 IEEE, pp. 496-498.

* cited by examiner

US 10,840,264 B2

ULTRA-THIN-BODY GAN ON INSULATOR DEVICE

FIELD OF THE INVENTION

The invention relates generally to an ultra-thin-body GaN-on-Insulator device, and more specifically, to a combined CMOS/GaN device. The invention relates further to a related method for bonding a GaN-based hetero-structure.

BACKGROUND

The standard CMOS technology is in many cases reaching physical limitations in terms of frequency and voltage. As a consequence, semiconductor devices, like III-V semiconductors have been introduced in order to address extended requirements for semiconductor functionality. In particular, a combination of GaN and Si electronics integrated into a single chip is highly welcome in high-frequency mobile devices, as well as in high-performance computing, for which novel point of load converters can offer large room for system performance improvements.

Bringing wide-bandgap materials into the platform of CMOS is one of the great challenges of today's research. With integrating GaN-on-CMOS (GaN is an example of such a wide-bandgap material) new semiconductor device characteristics and functionalities can be realized together with CMOS devices, e.g., the realization of on-chip point of load converters. This may enable a smaller packaging effort and a smaller overall device foot-print. Additionally, only one converter stage instead of three may be required (48V-to-1V instead of 48V-to-12V-to-3V-to-1V) which may bring down manufacturing cost significantly. Thus, a consolidation on the same integrated circuit of e.g., a hybrid switching power converter that takes advantage of the established circuit topologies of CMOS structures and of the higher mobility and voltage withstanding of III-N (e.g., GaN) HEMT devices using a simplified manufacturing process may represent a significant step forward in many application areas.

There are several disclosures related to an ultra-thin-body GaN-on-Insulator device. Document US 20120305992 A1 discloses a hybrid integrated circuit comprising CMOS and III-V devices. However, this document describes a direct growth of III-V material on silicon which may not be realizable without damaging potentially available silicon devices.

The Document titled Ultrathin Body GaN-on-Insulator Quantum Well FETs With Regrown Ohmic Contacts, published by Guowang Li et al in IEEE Electronic Device Letter, Vol. 33, No. 5, May 2012 discloses a realization of strained GaN quantum-well transistors embedded in unstrained AlN as an insulator. However, this method involves a huge amount of strain which may cause a large number of crystal defects and thus poor performance of the resulting devices.

Therefore, there may be a need to overcome the limitations of the known technology, in particular overcoming strains in the devices, as well as keeping the manufacturing of the Si-based devices and the III-N based devices as long as possible separated while at the same time allowing ultrathin integrated circuits.

SUMMARY

According to one aspect of the present invention, an ultra-thin-body GaN-on-Insulator device may be provided. The ultra-thin-body GaN-on-Insulator device may comprises a front-end-of-line processed CMOS platform terminated with an interlayer dielectric material, a first bonding layer atop the interlayer dielectric material, an ultra-thin-body GaN-based hetero-structure terminated with a second bonding layer. Thereby, the GaN-based hetero-structure may be bonded with the second bonding layer to the first bonding layer of the CMOS platform.

According to another aspect of the present invention, a method for bonding a GaN-based hetero-structure may be provided. The method for bonding a GaN-based hetero-structure may comprise depositing a first bonding layer atop a processed CMOS platform terminated with an interlayer dielectric material, depositing a second bonding layer atop a GaN-based hetero-structure and bonding the second bonding layer onto the first bonding layer. Thereby, a GaN-based hetero-structure may be built atop the CMOS platform.

It may also be noted that the materials mentioned in this description are the preferred materials, but not the exclusive ones that are being claimed. Although with respect to the ultra-thin-body GaN-based hetero-structure reference is often made to GaN, the buffer layer, the channel layer and the barrier material may as well be any III-N material, i.e., any combination of $Al_xGa_yIn_{1-x-y}N$.

The proposed ultra-thin-body GaN-on-Insulator device may offer multiple advantages and technical effects:

It may allow an elegant way of combining well introduced CMOS/SOI platforms with GaN-based devices in one single integrated circuit. The possibility of integrating Ga-polar or N-polar devices allows a high design flexibility using a low-defect ultra-thin GaN buffer.

This may enable an improved performance if compared to other ultra-thin-body solutions. In particular, no intermediate handling wafer may be necessary. Additionally, the resulting GaN devices behave as is known to the industry (Ga-polar vs. N-polar). The top GaN layer of the devices can be scaled to match breakdown voltage needs for e.g., 48V devices now often used in, e.g., advanced automotive solutions or other mechatronic systems. As an example, a 150 nm thick GaN layer may be enough to meet the $V_{breakdown}$ criteria of a 48V device.

The proposed method allows an elegant way to produce high-quality ultra-thin GaN channels with a low number of defects if compared to known solutions. The eliminated need for using a handling wafer as well as the resulting shallow topography is instrumental to lower production costs. The ultra-thin-body GaN device may be integrated on top of an oxide (of a CMOS platform) with a vertical gate/channel separation of max. 50 nm because a III-N interlayer (as would be necessary for direct growth on the CMOS chip) is not required.

As another advantage, it may also be noted that an overheating ("meeting the thermal budget") of the underlying CMOS structure may be avoided.

In the following, additional embodiments of the inventive concept will be described.

According to allowable embodiments of the device, the ultra-thin-body GaN-based hetero-structure may be Ga-polar or N-polar. Thus, both alternatives may be allowable. Hence, N-polar as well as Ga-polar (pseudo)substrate may be used as platform for building the second half of the joint CMOS/GaN hybrid IC.

According to one permissive embodiment of the device, the CMOS platform may be an SOI device. Thus, classical CMOS as well as more modern SOI (Silicon-on Insulator) raw devices made by used a CMOS platform. The here proposed process—and thus the resulting device—is agnostic to the used technology of the CMOS platform.

According to one preferred embodiment of the device, the ultra-thin-body GaN-based hetero-structure may comprise an Al(Ga,In)N barrier layer atop to bonding layer. This may separate a next layer—the GaN channel layer—from the bonding layer.

Alternatively, the GaN channel may be built atop the bonding layer. In this case, an Al(Ga,In)N barrier layer is built atop the Ga channel layer.

Hence, for both cases—N-polar and Ga-polar—the adequate layer structure may be built in order to manufacture the ultra-thin body GaN device on top the FEOL-processed CMOS platform such that the ultra-thin body GaN device may have comparable characteristics.

According to one advantageous embodiment of the device, the ultra-thin-body GaN-based hetero-structure may comprise a passivation layer of, e.g. SiN atop the GaN channel layer. Hence, the structure may be protected against environmental influences. The passivation layer may also be instrumental for further process steps.

In case of starting with the alternative polarity of the substrate, the passivation layer would be deposited atop the Al(Ga,In)n barrier layer.

According to one additionally preferred embodiment of the device, the passivation layer may have a maximum thickness of 10 to 100 nm, preferably 10 to 20 nm, more preferably 20 to 50 nm and most preferably 50 to 100 nm. Thus, the chip designer may choose the most suitable thickness based on any other process constraints and device characteristics.

According to another preferred embodiment of the device, a combined thickness of the first bonding layer, the second bonding layer, the Al(Ga,In)N barrier layer and the GaN channel layer may be 15 to 100 nm. Thus, especially with the lower end of the range, the characteristics of an UTB (ultra-thin-body) device may be met. In one embodiment, the combined thickness may be in the range of 15 to 30 nm. A skilled person may note here that this is a differentiator against known devices requiring a buffer layer of about 1 µm. This is about a factor close to 100 if compared to the combined thickness of the Al(Ga,In)N barrier layer and the GaN channel layer.

According to a further embodiment, the device may also comprise an isolated MESA structure comprising a source contact and a drain contact reaching from a upper surface of the passivation layer—in particular through the Al(Ga,In)N barrier—into the GaN channel layer, i.e., working as ohmic contacts to the 2-D electron gas, 2DEG. Hence, known device structure may now be built into the UTB of the device.

According to a further enhanced embodiment of the device, the MESA structure may also comprise a gate element integrated into the passivation layer. Optionally, the gate may be surrounded on 5 sides by an oxide (4 sides and the bottom).

According to an additionally preferred embodiment, the device may also comprise at least one metal layer bringing a device of the CMOS platform in electrical contact with an element of a device of the ultra-thin-body GaN-based hetero-structure. Thus, for connection, an element of the CMOS platform and an element of the GaN hetero-structure known metallization technologies (back-end-of-the-line, BEOL) may be used to build an integrated CMOS/GaN integrated circuit.

According to a preferred embodiment of the method, the building of said GaN-based hetero-structure may comprise providing a Ga-polar pseudo substrate, depositing a AlGaN buffer layer atop said Ga-polar pseudo substrate, depositing a GaN channel layer atop said AlGaN buffer layer and depositing a Al(Ga,In)N barrier layer atop said GaN channel layer. Thereby, a 2D electron gas may be built at a hetero-interface between said Al(Ga,In)N barrier layer and said GaN channel layer.

In case the process is started with an N-polar pseudo substrate, the process steps may be as follows: depositing a GaN buffer layer atop said pseudo N-polar substrate, depositing a Al(Ga,In)N barrier layer atop said GaN buffer layer and depositing a GaN channel layer atop said Al(Ga,In)N barrier layer. Thereby, the 2D electron gas may be built at the hetero-interface between said Al(Ga,In)N barrier layer and said GaN channel layer.

According to a further preferred embodiment, the method may also comprise flipping said GaN-based hetero-structure with said deposited second bonding layer atop said GaN-based hetero-structure upside down before bonding and removing said Ga-polar or N-polar pseudo substrate and said AlGaN or GaN buffer layer completely.

According to a further preferred embodiment, the method may also comprise building a MESA structure in the GaN-based hetero-structure, wherein the MESA structure may comprise a source contact and a drain contact (i.e., ohmic contacts to the 2DEG) reaching from an upper surface of said passivation layer into said GaN channel layer. Hence, known device structure may now be built into the layers built up to now. The MESA structure may also be vertically isolated using known process steps.

Last but not least, according to a further embodiment the method may comprise depositing at least one metal layer and bringing a device of the CMOS platform in electrical contact with an element of a device of the ultra-thin-body GaN-based hetero-structure. This way, the CMOS devices of the CMOS platform and the GaN based devices may be integrated into one single interconnected integrated circuit.

BRIEF DESCRIPTION OF THE SEVERAL VIEWS OF THE DRAWINGS

It should be noted that embodiments of the invention are described with reference to different subject-matters. In particular, some embodiments are described with reference to method type claims, whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be disclosed within this document.

The aspects defined above, and further aspects of the present invention, are apparent from the examples of embodiments to be described hereinafter and are explained with reference to the examples of embodiments, but to which the invention is not limited.

Preferred embodiments of the invention will be described, by way of example only, and with reference to the following drawings.

Figure 1:
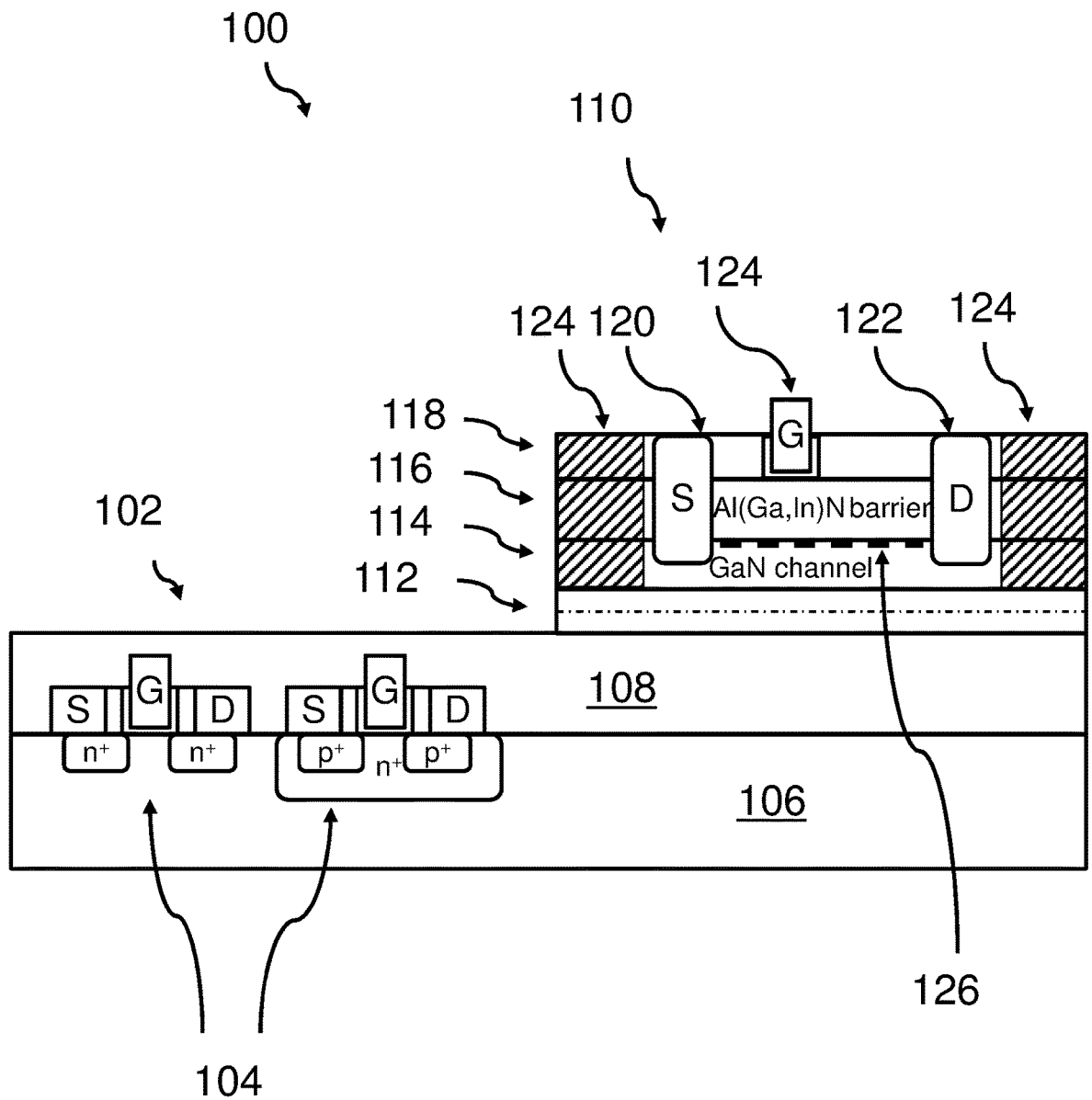

FIG. 1 shows an embodiment of the ultra-thin-body Ga-polar GaN-on-Insulator device on the FEOL-processed CMOS platform.

Figure 2:
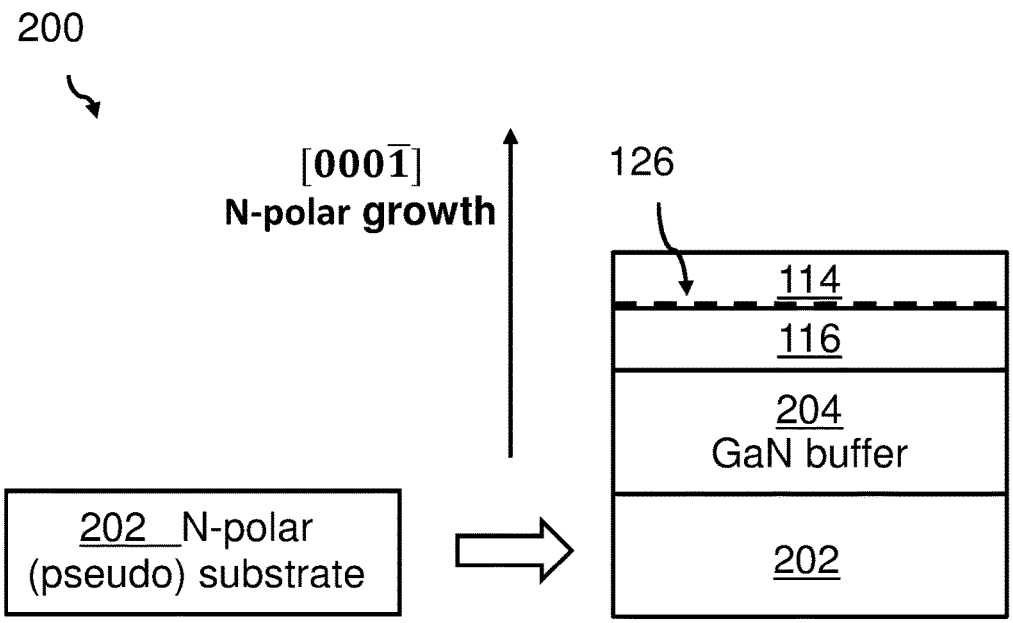

FIG. 2 shows an example for an N-polar grown GaN hetero-structure.

Figure 3:
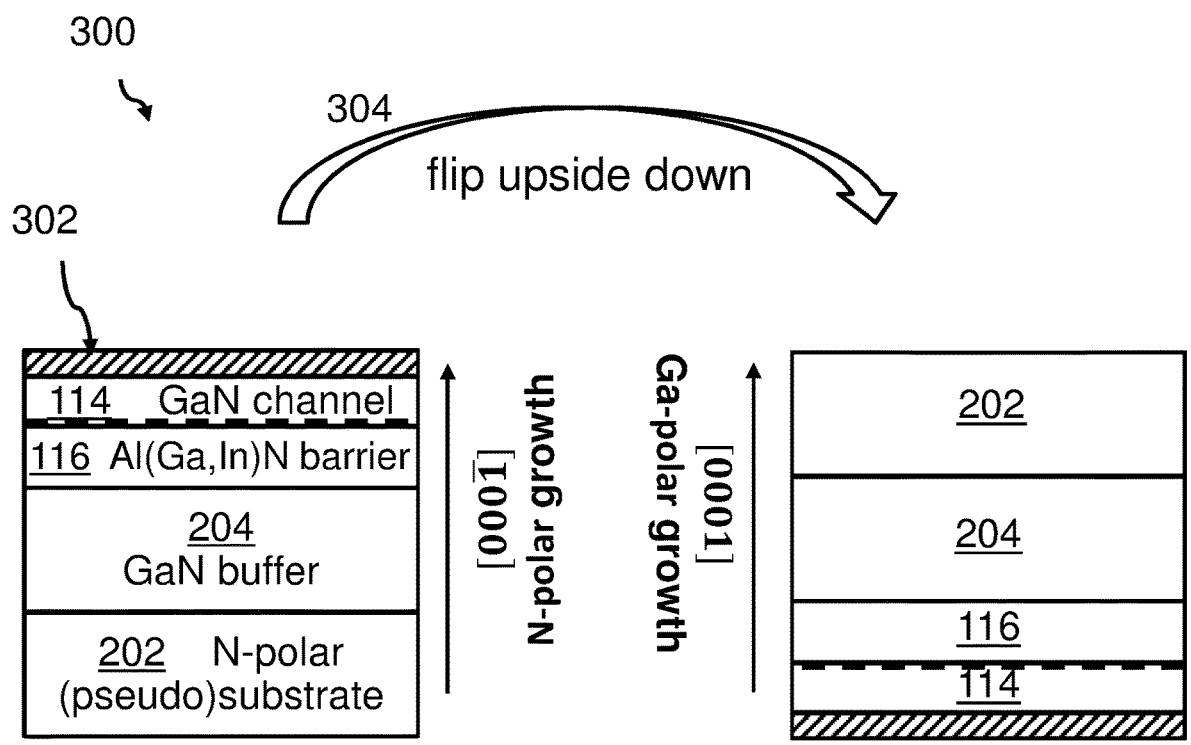

FIG. 3 shows exemplary the process of flipping the GaN hetero-structure upside down to convert the N-polarity to a Ga-polarity of the GaN hetero-structure.

Figure 4:
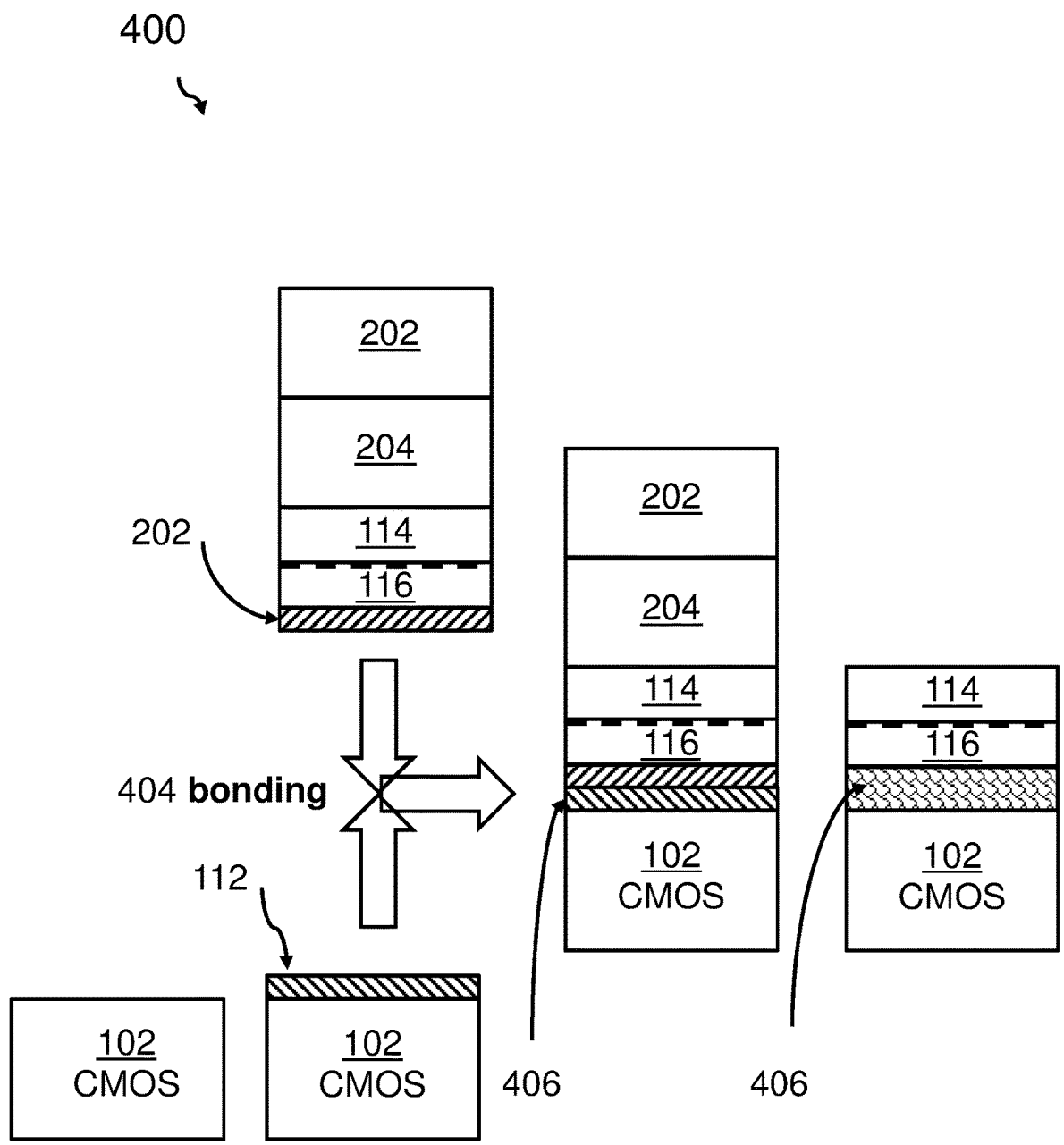

FIG. 4 shows exemplary the bonding process of the FOEL-processed CMOS platform with the flipped GaN hetero-structure.

Figure 5:
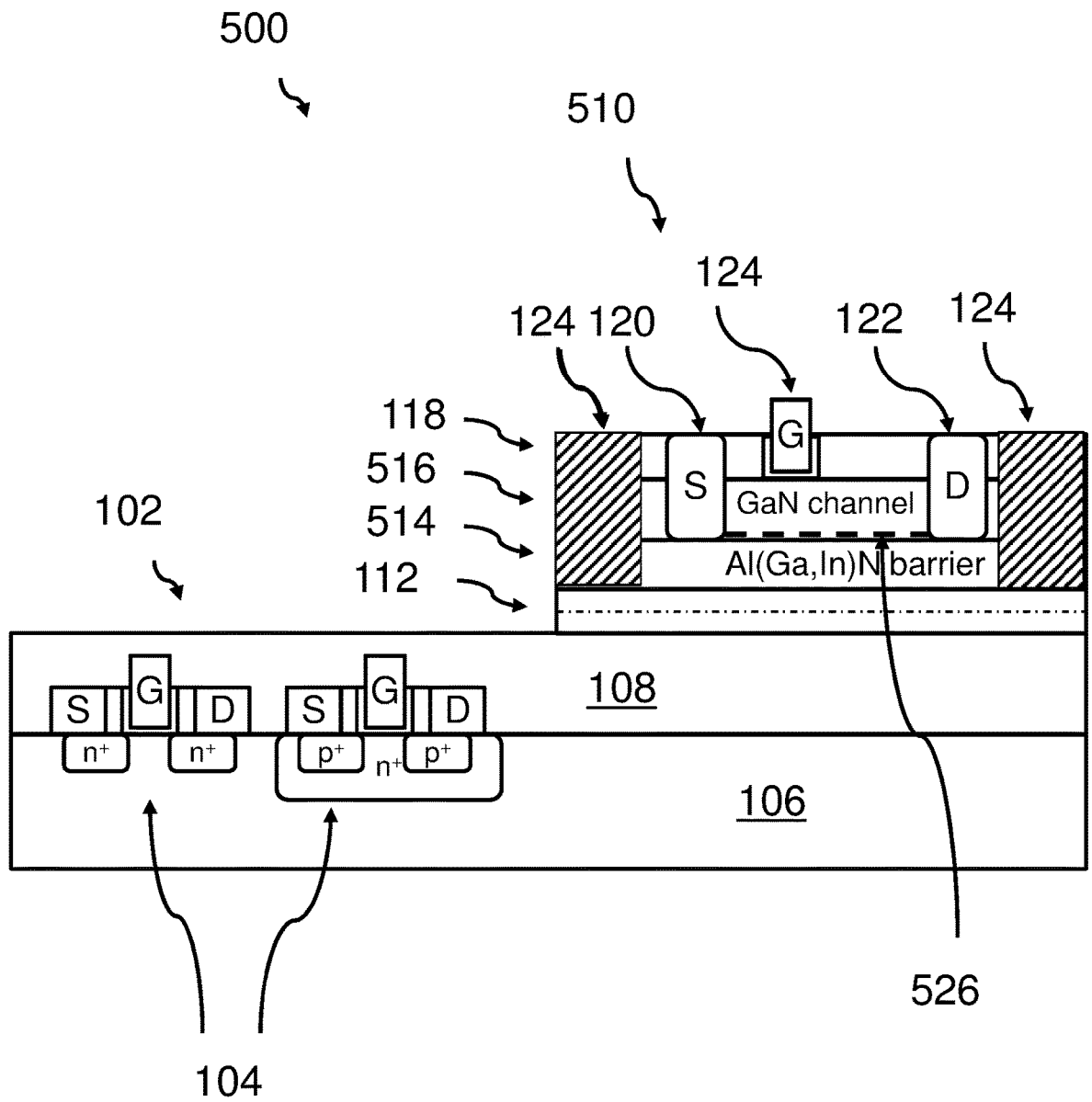

FIG. 5 shows an embodiment of the ultra-thin-body N-polar GaN-on-Insulator device on the FEOL-processed CMOS platform.

Figure 6:
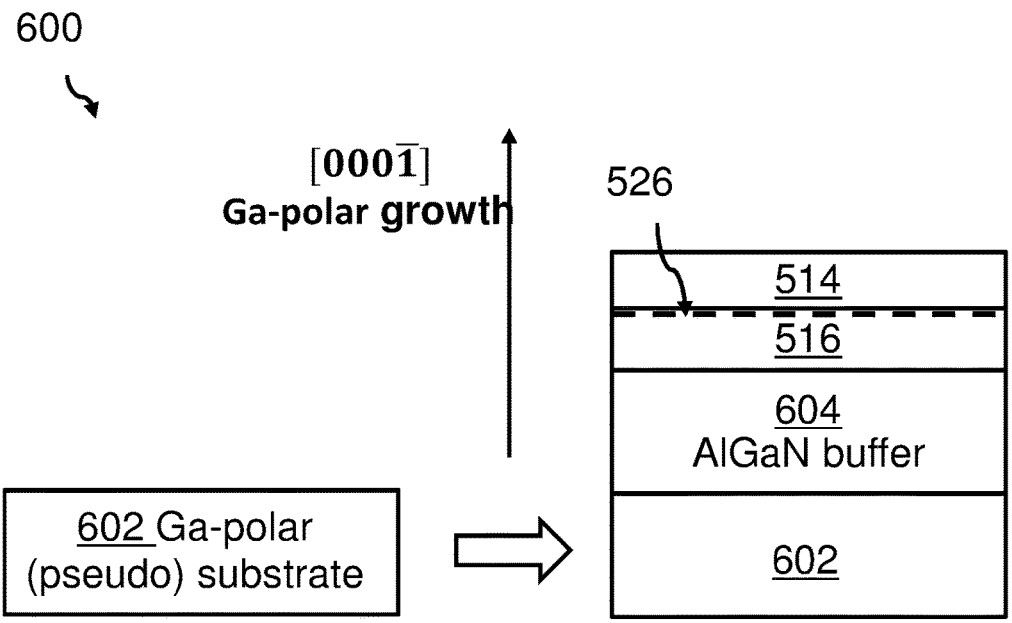

FIG. 6 shows an example for an Ga-polar grown GaN hetero-structure.

Figure 7:
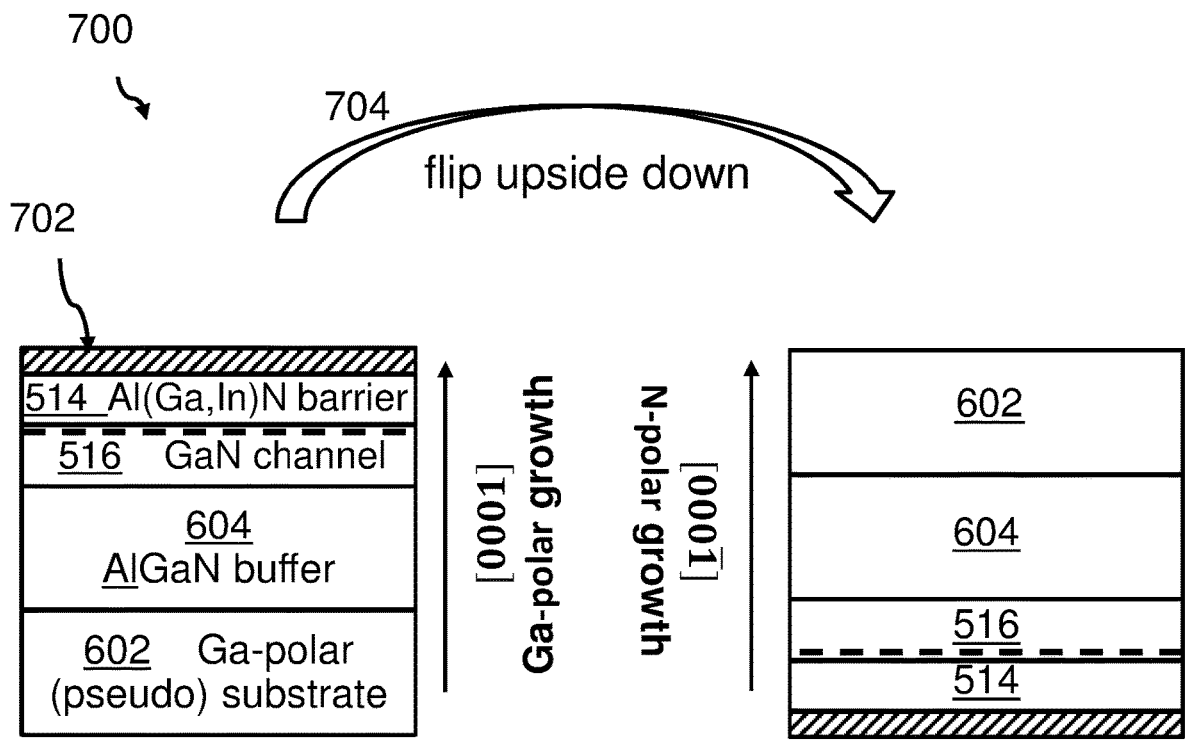

FIG. 7 shows exemplary the process of flipping the GaN hetero-structure upside down to convert the Ga-polarity to a N-polarity of the GaN hetero-structure.

Figure 8:
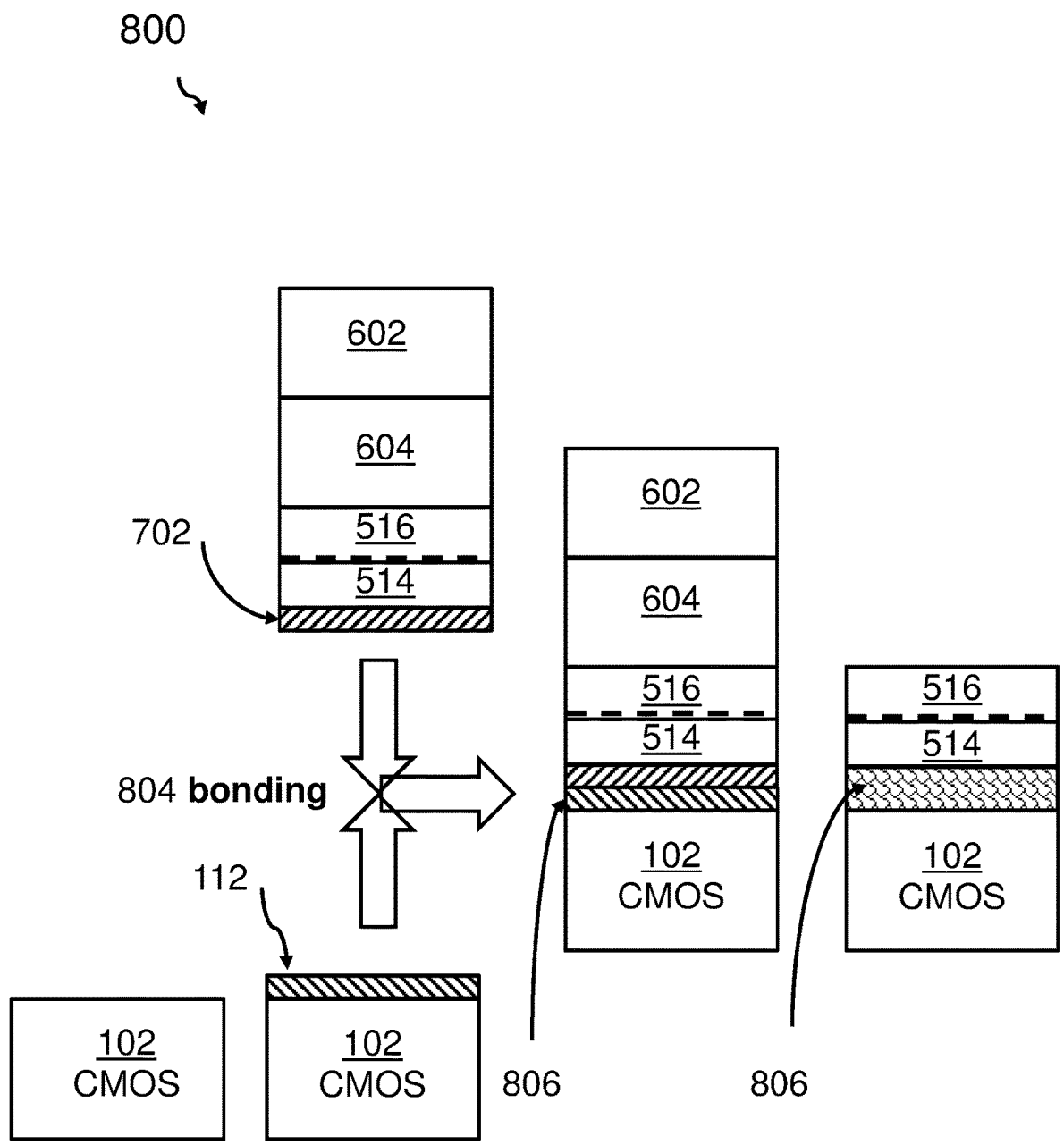

FIG. 8 shows exemplary the bonding process of the FEOL-processed CMOS platform with the flipped GaN hetero-structure.

Figure 9:
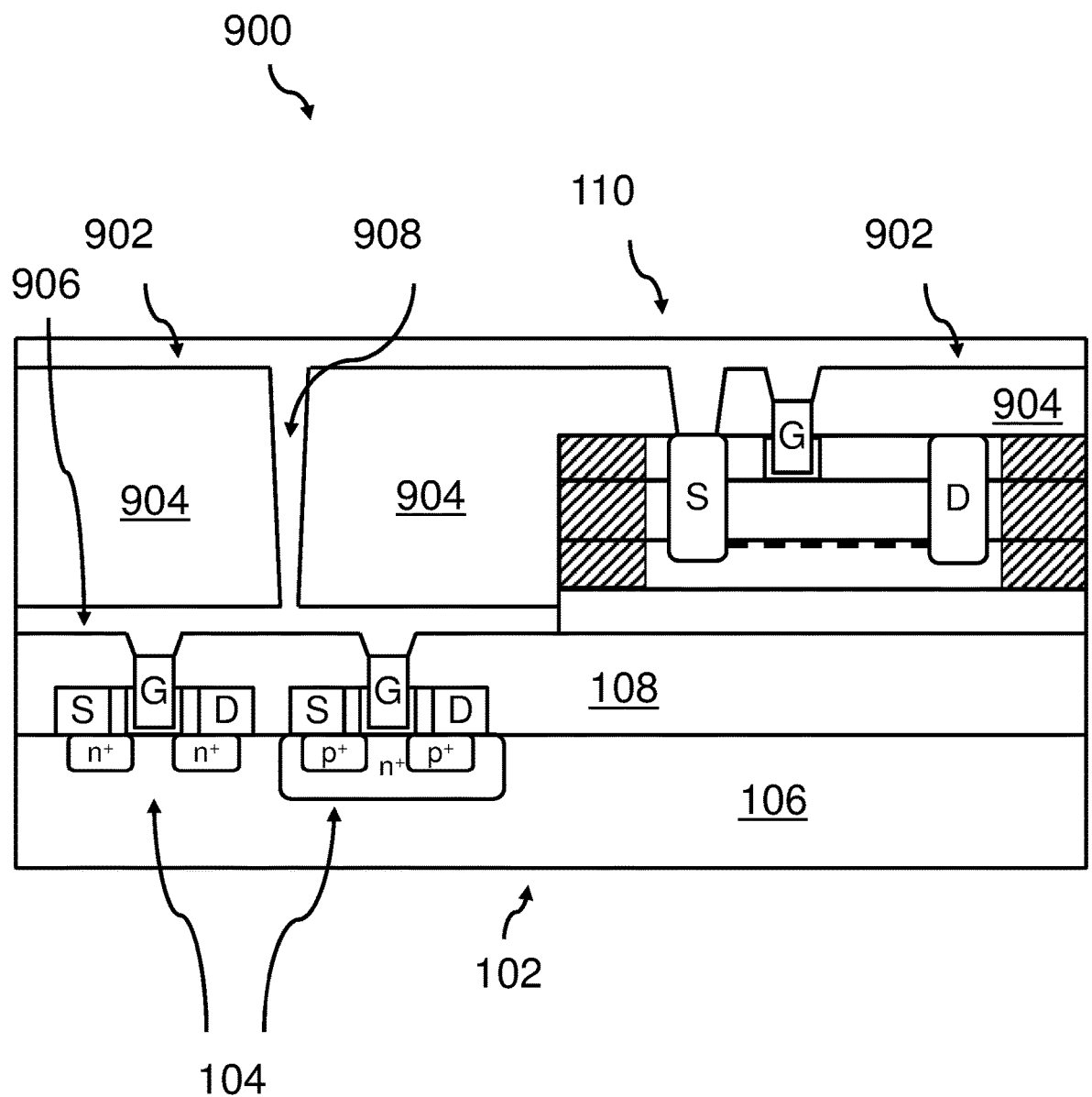

FIG. 9 shows an embodiment of the ultra-thin-body Ga-polar GaN-on-Insulator device together with the FOEL-processed CMOS platform and an exemplary metallization interconnect.

Figure 10:
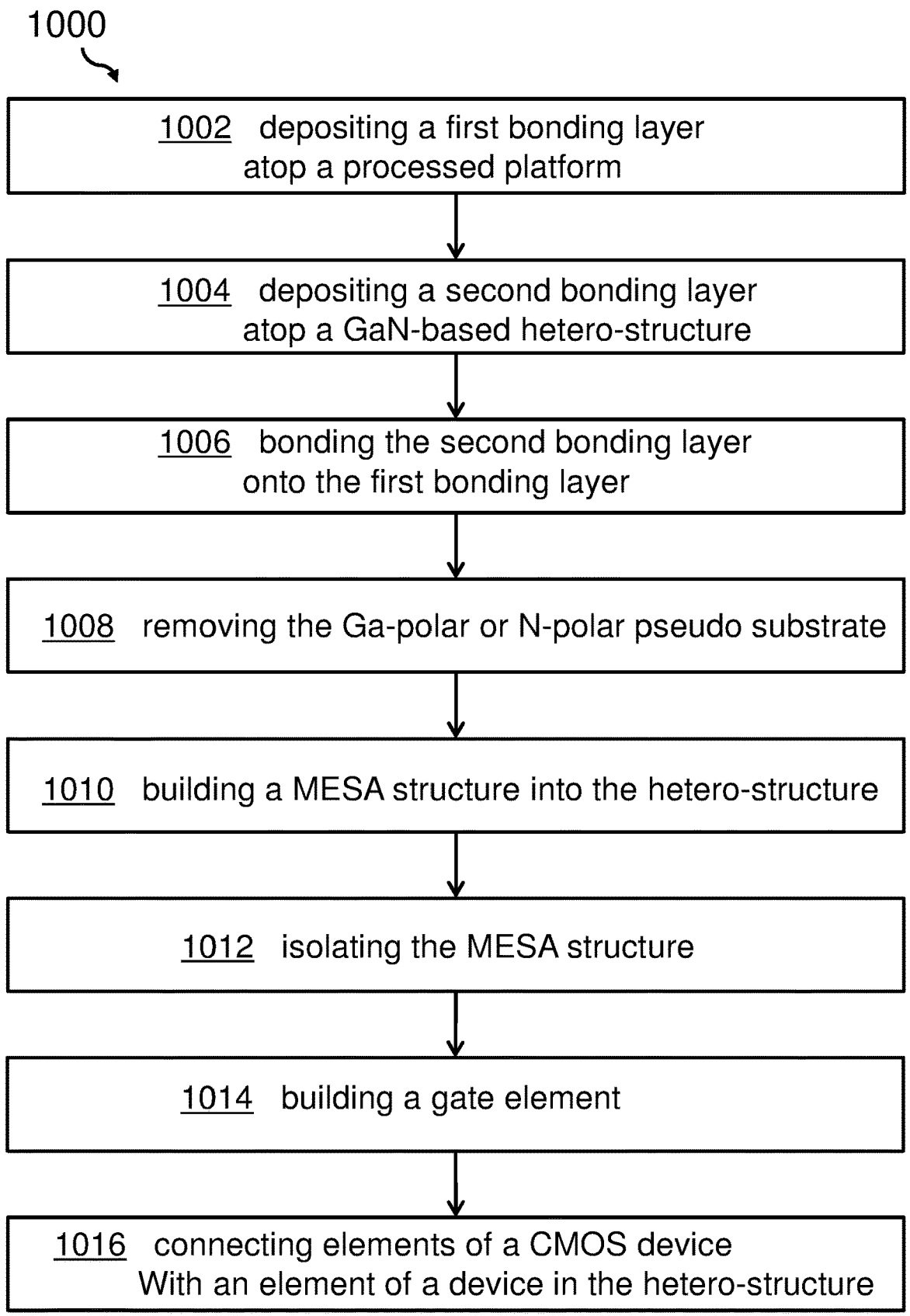

FIG. 10 shows an embodiment of a flow of process steps for manufacturing the ultra-thin-body Ga-polar GaN-on-Insulator device.

DETAILED DESCRIPTION

In the context of this description, the following conventions, terms and/or expressions may be used:

The term 'front-end-of-the-line'—in brief, FEOL—may denote the first portion of IC fabrication where the individual devices (transistors, capacitors, resistors, etc.) are patterned in the semiconductor. FEOL generally covers everything up to (but not including) the deposition of metal interconnect layer. In particular, FEOL may comprise all processes of CMOS fabrication needed to form fully isolated CMOS elements, like selecting the type of wafer to be used; chemical-mechanical planarization and cleaning of the wafer, shallow trench isolation (STI) (or LOCOS in early processes, e.g., with feature size >0.25 μm), well formation, gate module formation and source and drain module formation. In the context of this document also the deposition of a cover layer, in particular an interlayer dielectric, like $SiO_2$ may be part of the FEOL-processed chip.

The term 'CMOS platform' may denote an abbreviation for the well-known technology for constructing integrated circuits for manufacturing Complementary Metal-Oxide-Semiconductors. CMOS technology is used in microprocessors, microcontrollers, static RAM, and other digital logic circuits. CMOS technology is also used for several analog circuits such as image sensors (CMOS sensor), data converters, and highly integrated transceivers for many types of communication.

The term 'SOI' may denote the acronym for Silicon-On-Insulator technology which refers to the use of a layered silicon-insulator-silicon substrate in place of conventional silicon substrates in the semiconductor manufacturing, especially microelectronics, to reduce parasitic device capacitance, thereby improving performance. SOI-based devices differ from conventional silicon-built devices in that the silicon junction is above an electrical insulator, typically silicon dioxide or sapphire (these types of devices are called silicon on sapphire, or SOS).

The term 'bonding layer'—in particular, first bonding layer as well as second boning layer—may denote an oxide containing layer deposited on a surface. The surface may be the FEOL-processed chip—for the first bonding layer—as well as the top of the GaN-based hetero-structure. The first, as well as the second bonding layer may comprise, e.g., $Al_2O_3$. As part of the process to manufacture the ultra-thin-body GaN-on-Insulator device, the two bonding layers may be brought into contact with each other and under pressure and applying heat, e.g., in the range of up to 450° C., the two bonding layers grow together. It may be noted that this bonding process does not have the purpose of an electrical bonding in order to make an electrical contact to each other. The purpose of this here used bonding process is to fix the prefabricated GaN-based hetero-structure atop the FEOL-processed CMOS platform.

It may be noted that here an oxide-to-oxide bonding (molecular bonding) is used and described, but other methods may work as well, like polymer bonding, fusion bonding etc.

The term 'interlayer dielectric material' may denote here a layer atop a FEOL-processed chip—e.g., CMOS or SOI—protecting the active parts of the semiconductor chip. The interlayer dielectric material may typically be an oxide, like $SiO_2$ or a nitride, like SiN.

The term 'ultra-thin-body GaN-based hetero-structure' may denote a composition of layers comprising a bonding layer, a III-N channel layer (e.g., GaN) and an Al(Ga,In)N barrier layer terminated with a passivation layer. The thickness of the bonding layer, the GaN channel layer and the Al(Ga,In)N barrier layer together may be in the range of 15 nm to 100 nm. However, also combined thickness of about 150 nm may be possible. In any case, a GaN buffer layer having a thickness of about 1 μm—as used in typical known devices—is not present.

It may also be noted that the materials mentioned in this description are the preferred materials, but not the exclusive ones that are being claimed. Buffer, channel and barrier material can be any III-N material, i.e., any combination of $Al_xGa_yIn_{1-x-y}N$.

The term 'Ga-polar' may denote in the context of this document the characteristic of a GaN hetero-structure having as its top layer N atoms. GaN has a wurtzite crystal structure. Thus, the substrate used to grow the Ga-polar GaN hetero-structure in [0001] direction has to have also a Ga-polar structure. Ga-polar is used as the industry standard. Ga-polar crystals have only one dangling bond at the surface (chemically more stable than N-polar).

The term 'N-polar_' may denote, in contrast to the Ga-polarity; a GaN hetero-structure having as its top layer Ga atoms. Thus, a [000$\bar{1}$] N-polar growth may be required for the GaN hetero-structure starting from an N-polar substrate. A skilled person knows that the polarity of the GaN hetero-structure is determined by the origin, i.e., substrate for the growth of additional crystal layers. N-polar crystals have three dangling bonds at the surface (chemically less stable than Ga-polar).

In the following, a detailed description of the figures will be given. All instructions in the figures are schematic. Firstly, a block diagram of an embodiment of the inventive ultra-thin-body GaN-on-Insulator device is given. Afterwards, further embodiments, as well as embodiments of the method for bonding a GaN-based hetero-structure, will be described.

FIG. 1 shows an embodiment 100 of the ultra-thin-body Ga-polar GaN-on-Insulator device 110 on the FEOL-processed CMOS platform 106. The device 100 comprises a front-end-of-line processed CMOS platform 106 which is terminated with an interlayer dielectric material 108. This may, e.g., be SiO$_2$. Several devices 104 are shown exemplarily as part of the FEOL-process devices. It may be noted that no metal layer is shown.

The device 100 comprises a first bonding layer 112—in particular a lower portion of the layer 112—atop the interlayer dielectric material 108. Additionally, the device 100 comprises an ultra-thin-body GaN-based hetero-structure terminated with a second bonding layer 112—particular the upper portion of the layer 112. It may be noted that in the shown status, the two bonding layers—i.e., the first and the second bonding layer—have been brought into contact to form pair of bonded layers which may be expressed by the thin, dashed, horizontal line in layer 112.

Additionally, a GaN layer 114 is shown, as well as an Al(Ga,In)N barrier layer 116. The GaN-based hetero-structure comprises also a passivation layer 118 and an isolated MESA structure comprising a source 120, a drain 122, a gate 124 and isolation barriers 124 (more details see below).

It may be noted that FIG. 1 shows one of the possible embodiments, in particular a Ga-polar GaN-based hetero-structure.

FIG. 2 shows an example 200 for an original N-polar grown GaN hetero-structure. Starting from an N-polar substrate 202—also be noted as pseudo-substrate because; it will be removed later—a GaN buffer layer 204 is deposited on the substrate 202. On top of the GaN buffer layer 204, an Al(Ga,In)N barrier layer 116, as already shown in FIG. 1, is deposited. Over, respectively atop, the Al(Ga,In)N barrier layer 116, the GaN channel layer 114 is deposited. A high mobility 2D electron gas 126 (2DEG) is forming at the Al(Ga,In)N/GaN interface in the GaN channel—shown as dashed line.

FIG. 3 shows exemplary the process 300 of flipping the [000$\bar{1}$] N-polar grown GaN hetero-structure upside down to convert the N-polarity to a Ga-polarity of the GaN hetero-structure. The flipping of the GaN hetero-structure is denoted with the arrow 304. It may be noted that before the flipping 304, the bonding layer 302 (having diagonal stripes) has been deposited atop the GaN channel layer 114. It may also be noted that the reference numerals of the flipped GaN hetero-structure are also shown upside down in order to explicitly show the reverse order of the layers if compared to the originally grown hetero-structure.

FIG. 4 shows exemplary the bonding process 400 of the FEOL-processed CMOS platform with the flipped GaN hetero-structure. The now Ga-polar GaN hetero-structure with the bonding layer 202 at the bottom is brought in contact with a bonding layer 112 atop the FEOL-processed CMOS platform 102 and a bonding process 404 is performed under the influence of a temperature of up to 450° C. such that the bonding layer 202 of the GaN hetero-structure and the bonding layer 112 of the FEOL-processed CMOS platform 102 is finally building a joint intermediate layer 406 between the FEOL-processed CMOS platform 102 and the flipped GaN hetero-structure. The joint intermediate layer 406 corresponds to the bonding layer 112 of FIG. 1.

In a next step, the substrate or pseudo-substrate 202, as well as the GaN buffer layer 204 are removed. This can, e.g., either be done by a wet etching process or by a smartcut process using H$^+$-implants.

As a next step, a passivation layer 118 (not shown here, compare FIG. 1), e.g., SiN can be deposited atop the Al(Ga,In)N barrier layer 116. The SiN passivation layer 118 compare FIG. 1) may have a thickness of up to 100 nm. Because of the removal the GaN buffer layer 204 (compare FIG. 2), the combined thickness of the bonding layer 112, the GaN channel layer 114, as well as the Al(Ga,In)N barrier layer 116 can be as thin as 15 nm. However, it may also have a thickness of up to 100 nm or even 150 nm.

As a next process step (refer again to FIG. 1), source S 120 and drain D 122, areas may be formed (by alloying of metal and III-N material, or by selective regrowth of highly doped n$^+$-GaN, or by ion implantation) through the passivation layer 118 (i.e., the passivation layer is locally removed at the designated areas, e.g. by wet or dry etching) and the Al(Ga,In)n barrier layer 116 (here, removal is not necessary but can be performed) into the GaN gate layer 114 such that the source S 120 and the drain D 122 reach to the 2D electronic gas 2DEG 126 at the interface of the Al(Ga,In)N barrier layer 116 and the GaN channel layer 114, as shown in FIG. 1. Also, a gate structure G may be formed atop the barrier layer 116 or within the barrier layer 116 (i.e., the barrier layer would be partly etched, e.g., by wet or dry etching.—Again, the passivation layer needs to be removed selectively beforehand). However, this may require a formation of an oxide layer within the passivation layer 116 before building the gate G structure 124. The oxide layer is shown as u-shaped around the gate G structure 124 passivation layer 118 (again, compare FIG. 1).

FIG. 5 shows another embodiment 500 of the ultra-thin-body N-polar GaN-on-Insulator device 510 on the FEOL-processed CMOS platform 102. In this case, it is an N-polar GaN-based hetero-structure instead of the Ga-polar GaN-based hetero-structure.

Here, the layers are slightly different, i.e., in reverse order: The joint bonding layer 112 is unchanged. However, layer 514 is an Al(Ga,In)N barrier layer atop the bonding layer of the GaN hetero-structure (portion of the combined bonding layer 112). Atop this Al(Ga,In)N barrier layer 514 is the GaN channel layer 516 which is then terminated with a passivation layer 118, known already from FIG. 1. The additional elements (source, drain, gate, passivation) are also visible (detail below) and comparable with corresponding elements of FIG. 1.

FIG. 6 shows an example 600 for an original Ga-polar grown GaN hetero-structure. Starting from a Ga-polar substrate 602—also be noted as pseudo-substrate because; it will be removed later—an AlGaN buffer layer 604 is deposited on the substrate 602. On top of the AlGaN buffer layer 604 a GaN channel layer 516, as already shown in FIG. 5, is deposited. Over, respectively atop, the GaN channel layer 516, the Al(Ga,In)N barrier layer 514 is deposited. A high mobility 2D electron gas 526 (2DEG) is forming at the Al(Ga,In)N/GaN interface—shown as dashed line. If compared to FIG. 1, the 2DEG is built again inside the GaN channel layer.

FIG. 7 shows exemplary the process 700 of flipping the [0001] Ga-polar grown GaN hetero-structure upside down to convert the Ga-polarity to an N-polarity of the GaN hetero-structure. The flipping of the GaN hetero-structure is denoted with the arrow 704. It may be noted that before the flipping 704, the bonding layer 702 (having diagonal stripes) has been deposited atop the Al(Ga,In)N barrier layer 514. It may also be noted that the reference numerals of the flipped GaN hetero-structure on the right side of the figure are also shown upside down in order to explicitly show the reverse order of the layers if compared to the originally grown hetero-structure.

FIG. 8 shows exemplary the bonding process 800 of the FEOL-processed CMOS platform 102 with the flipped GaN hetero-structure. The now (flipped)N-polar GaN hetero-structure with the bonding layer 702 at the bottom is brought in contact with a bonding layer 112 atop the FEOL-processed CMOS platform 102 and a bonding process 804 is performed under the influence of a temperature of up to 450° C. such that the bonding layer 702 of the GaN hetero-structure and the bonding layer 112 of the FEOL-processed CMOS platform 102 is finally building a joint intermediate layer 806 between the FEOL-processed CMOS platform 102 and the flipped GaN hetero-structure. The joint intermediate layer 806 corresponds to the bonding layer 112 of FIG. 5.

In a next step, the substrate or pseudo-substrate 602, as well as the AlGaN buffer layer 604 are removed. This can, e.g., either be done by a wet etching process or by a smartcut process using $H^+$-implants.

As a next step, a passivation layer 118 (not shown here, compare FIG. 5), e.g., SiN can be deposited atop the GaN channel layer 516. The SiN passivation layer 118 (compare FIG. 1) may have a thickness of up to 100 nm. Because of the removal the AlGaN buffer layer 604 (compare FIG. 6), the combined thickness of the bonding layer 112, the Al(Ga,In)N barrier layer 516, as well as the GaN channel layer 514 can also be as thin as 15 nm. However, it may also have a thickness of up to 100 nm or even 150 nm.

As a next process step (refer again to FIG. 5), source S 120 and drain D 122 areas may be formed (by alloying of metal and III-N material, or by selective regrowth of highly doped $n^+$-GaN, or by ion implantation) through the passivation layer 118 (i.e. the passivation layer is locally removed at the designated areas, e.g. by wet or dry etching) into the GaN gate layer 516 such that the source S 120 and the drain D 122 reach to the 2D electronic gas 2DEG 526 at the interface of the Al(Ga,In)N barrier layer 514 and the GaN channel layer 516, as shown in FIG. 5. Also, a gate structure G 124 is formed over the channel layer 516 or within the passivation layer 118 (i.e., the passivation layer 118 would be partly etched, e.g. by wet or dry etching). However, this may require a formation of an oxide layer within the passivation layer 118 before building the gate G structure 124. The oxide layer is also here shown as u-shaped around the gate G structure 124 (again, compare FIG. 5).

FIG. 9 shows an embodiment 900 of the ultra-thin-body Ga-polar GaN-on-Insulator device (of FIG. 1) together with the FEOL-processed CMOS platform 102 and an exemplary metallization interconnect. However, for the sake of metal connections, there is no fundamental difference between the Ga-polar and the N-polar GaN hetero-structure. Therefore, this metallization is only shown for the example of FIG. 1.

If compared to FIG. 1, the FEOL-processed CMOS platform 102 comprises now also a metal layer 906 to connect parts of the semiconductor devices 104 of the CMOS platform 102 electrically. Also, elements—shown here source and gate—of the FEOL-processed CMOS platform ultra-thin-body GaN-on-Insulator device, are connected with the metal layer 902 which sits atop a second interlayer dielectric 904. This has been deposited atop the metal layer 906. It may contain interconnect vias 908 also filled with metal in order to interconnect the metal layer 902 with a metal layer 906. This way, electronic circuits comprising CMOS devices and ultra-thin-body GaN devices are interconnected as part of the same integrated circuit.

FIG. 10 shows an embodiment of a method 1000 for bonding a GaN-based hetero-structure in a series of process steps for manufacturing the ultra-thin-body Ga-polar GaN-on-Insulator device. The method 1000 comprises depositing, 1002, a first bonding layer atop a processed CMOS platform terminated with an interlayer dielectric material, depositing, 1004, a second bonding layer atop a GaN-based hetero-structure and bonding the second bonding layer onto the first bonding layer. Thereby, GaN-based hetero-structure is built atop the CMOS platform.

It may be noted that the interlayer dielectric material may be planarized before the first bonding layer is deposited.

Additional steps of a more comprehensive method 1000 may also comprise removing, 1008, the substrate (or pseudo substrate) and the GaN (case of FIGS. 1 to 4) or the AlGaN buffer layer (case of FIGS. 5 to 8) completely, by etching or H-implant with smart cut removing process. Furthermore, the method may comprise building, 1010, an isolated MESA structure comprising a source element and a drain element reaching from an upper surface of the passivation layer into the GaN channel layer. The MESA structure may be isolated, 1012 and a gate element can be integrated, 1014, into the passivation layer. Last but not least, elements of the CMOS device of the CMOS platform may be connected, 1016, electrically with elements of the GaN-based device of the GaN-based hetero-structure.

The descriptions of the various embodiments of the present invention have been presented for purposes of illustration, but are not intended to be exhaustive or limited to the embodiments disclosed. Many modifications and variations will be apparent to those of ordinary skills in the art without departing from the scope and spirit of the described embodiments. The terminology used herein was chosen to best explain the principles of the embodiments, the practical application or technical improvement over technologies found in the marketplace, or to enable others of ordinary skills in the art to understand the embodiments disclosed herein.

The terminology used herein is for the purpose of describing particular embodiments only and is not intended to limit the invention. As used herein, the singular forms "a", "an" and "the" are intended to include the plural forms as well, unless the context clearly indicates otherwise. It will further be understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or steps plus function elements in the claims below are intended to include any structure, material, or act for performing the function in combination with other claimed elements, as specifically claimed. The description of the present invention has been presented for purposes of illustration and description, but is not intended to be exhaustive or limited to the invention in the form disclosed. Many modifications and variations will be apparent to those of ordinary skills in the art without departing from the scope and spirit of the invention. The embodiments are chosen and described in order to best explain the principles of the invention and the practical application, and to enable others of ordinary skills in the art to understand the invention for various embodiments with various modifications, as are suited to the particular use contemplated.

What is claimed is:

1. An ultra-thin-body GaN-on-Insulator device partially stacked on top of a complementary metal-oxide semiconductor (CMOS) device, comprising:
   a front-end-of-line (FEOL) processed CMOS platform terminated with an interlayer dielectric material;
   a first bonding layer atop the interlayer dielectric material, wherein the interlayer dielectric material is planarized before the first bonding layer is deposited;
   an ultra-thin-body GaN-based hetero-structure terminated with a second bonding layer, wherein the ultra-thin-body GaN-based hetero-structure is bonded with the second bonding layer, and partially stacked, on top of the first bonding layer of the CMOS platform, and wherein the ultra-thin-body GaN-based hetero-structure comprises a combined thickness of the following layers in the range of 15 nm to 100 nm: the first bonding layer, the second bonding layer, a GaN channel layer, and a Al(Ga,In)N barrier layer; and at least one metal layer on the ultra-thin-body GaN-on-Insulator device bringing the CMOS device in electrical contact with an element of the ultra-thin-body GaN-on-Insulator device, wherein the one or more bonding layers of the ultra-thin-body GaN-based hetero-structure permits at least one metal layer to be deposited on the GaN-on-Insulator device and the CMOS device, independently, without causing damage to the one or more bonding layers.

2. The device according to claim 1, wherein the ultra-thin-body GaN-based hetero-structure is Ga-polar or N-polar.

3. The device according to claim 1, wherein the CMOS platform is a silicon on insulator (SOI) device.

4. The device according to claim 1, wherein the ultra-thin-body GaN-based hetero-structure comprises the Al(Ga,In)N barrier layer atop the second bonding layer.

5. The device according to claim 4, wherein the ultra-thin-body GaN-based hetero structure comprises a GaN channel layer atop the Al(Ga,In)N barrier layer.

6. The device according to claim 5, wherein the ultra-thin-body GaN-based hetero structure comprises a passivation layer atop the GaN channel layer.

7. The device according to claim 6, wherein the passivation layer has a maximum thickness of 10 to 100 nm.

8. The device according to claim 6, also comprising an isolated MESA structure comprising a source element and a drain element reaching from an upper surface of the passivation layer into the GaN channel layer.

9. The device according to claim 8, wherein the MESA structure further comprises a gate element integrated into the passivation layer.

* * * * *

UNITED STATES PATENT AND TRADEMARK OFFICE
CERTIFICATE OF CORRECTION

PATENT NO. : 10,840,264 B2
APPLICATION NO. : 15/718215
DATED : November 17, 2020
INVENTOR(S) : Lukas Czornomaz et al.

Page 1 of 1

It is certified that error appears in the above-identified patent and that said Letters Patent is hereby corrected as shown below:

On the Title Page

Item (72), should read:
Lukas Czornomaz, Zurich, SWITZERLAND;
Utz Herwig Hahn, Adliswil, SWITZERLAND Signed and Sealed this
Fifteenth Day of February, 2022

Drew Hirshfeld
*Performing the Functions and Duties of the*
*Under Secretary of Commerce for Intellectual Property and*
*Director of the United States Patent and Trademark Office*